United States Patent [19]
Palm et al.

[11] Patent Number: 6,091,267
[45] Date of Patent: Jul. 18, 2000

[54] LOGIC CIRCUITS

[75] Inventors: Thomas Palm, Bromma; Lars Thylén, Huddinge, both of Sweden

[73] Assignee: Telefonaktiebolaget LM Ericsson, Stockholm, Sweden

[21] Appl. No.: 09/032,061

[22] Filed: Feb. 27, 1998

[30] Foreign Application Priority Data

Sep. 1, 1995 [SE] Sweden .................................. 9503023

[51] Int. Cl.[7] .................................................. H03K 19/00
[52] U.S. Cl. ............................. 326/136; 326/104; 326/17
[58] Field of Search ...................................... 326/104, 136, 326/17, 31; 327/424, 438, 429, 440, 446, 467, 469, 476; 250/214 SW

[56] References Cited

U.S. PATENT DOCUMENTS

| | | | |
|---|---|---|---|
| 5,074,631 | 12/1991 | Hamano et al. ............................. | 385/3 |
| 5,367,274 | 11/1994 | Thylén . | |
| 5,461,684 | 10/1995 | Vinchant et al. . | |
| 5,524,154 | 6/1996 | Bergland et al. . | |
| 5,566,263 | 10/1996 | Smith et al. ............................... | 385/40 |

OTHER PUBLICATIONS

S. Datta et al. "Proposed Structure for Large Quantum Interference Effects", Feb. 1996, Appl. Phys. Lett., vol. 48, No. 7.

Palm et al. "Analysis of an Electron–Wave Y–Branch Switch", Jan. 1992, Appl. Phys. Lett., vol. 60, No. 2.

Palm et al. "Quantum Interfenece Devices and Field–Effect Transistors: A Switch Energy Comparison", Jul. 1993, J. Appl. Phys., vol. 74, No. 1.

*Primary Examiner*—Michael Tokar
*Assistant Examiner*—Anh Tran
*Attorney, Agent, or Firm*—Nixon & Vanderhye, P.C.

[57] ABSTRACT

A logic circuit having at least a first input terminal and at least a first output terminal, comprises at least a first and a second electron-wave Y-branch switch, each having a source, a first drain, a second drain, and at least a first gate for switching a source current between the first and the second drain. The sources of said first and second Y-branch switches are adapted to be connected to a high voltage supply and a low voltage supply, respectively. The first gates of said first and second Y-branch switches are interconnected, and the interconnection point between said first gates constitutes said first input terminal. The first drain of the first Y-branch switch is connected to the second drain of the second Y-branch switch, and the second drain of the first Y-branch switch is connected to the first drain of the second Y-branch switch. The interconnection point between said second drain of the first Y-branch switch and said first drain of the second Y-branch switch constitutes said first output terminal.

9 Claims, 2 Drawing Sheets

LOGIC CIRCUITS

TECHNICAL FIELD

The invention relates to a logic circuit having at least one input terminal and at least one output terminal.

BACKGROUND OF THE INVENTION

For a long time, transistors have dominated digital electronics. Mainly by reducing device size, it has been possible to increase packing density and speed by several orders of magnitude. Nevertheless, by reducing the device size, new phenomena become important which may cause problems for the transistors but which also may open up possibilities for new devices.

When device sizes are reduced to below the inelastic and elastic scattering length, the ballistic region is entered, where the common drift/diffusion model fails. Instead, electrons travel in straight lines and are reflected and refracted like lightwaves. Thus, when the width of an electric wire approaches that of the electron wavelength (tens of nm in semiconductors) the wire should be treated as a waveguide analogous to an optical fibre. From i.a. "Analysis of an electron-wave Y-branch switch" by Thomas Palm and Lars Thylén in Appl. Phys. Lett. 60 (2), Jan. 13, 1992, pages 237–239, and U.S. Pat. No. 5,367,274, a so called electron-wave Y-branch switch built of electron waveguides, is known. As apparent from these publications, the Y-branch switch is based on modal evolution and has a monotonic response to a changed gate voltage. By creating an electric field perpendicular to a branching waveguide, electrons can be forced to enter the branch with the highest electrostatic potential.

An advantage of the Y-branch switch over a field effect transistor (FET) is that it has added functionality in that it switches current between two outputs rather than turning a current on or off.

An additional advantage is the potential for low voltage operation. Unlike the FET, the Y-branch does not require a switching voltage larger than the thermally limited voltage $k_BT/e$, where $k_B$ is Boltzmann's constant. (See "Quantum interference devices and field-effect transistors: A switch energy comparison" by T. Palm., L. Thylén, O. Nilsson, and C. Svensson in J. Appl. Phys., Vol. 74, No. 1, pp. 687–694, 1993.)

BRIEF DISCLOSURE OF THE INVENTION

The object of the invention is to design logic circuits using electron-wave Y-branch switches.

According to the invention, this is attained by the logic circuits set forth in the claims.

BRIEF DESCRIPTION OF THE DRAWING

The logic circuits according to the invention will be described more in detail below with reference to the appended drawing on which

PREFERRED EMBODIMENTS

Figure 1:
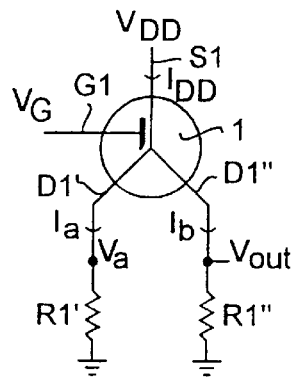
FIG. 1 shows a first embodiment of an inverter.

FIG. 1 shows a first embodiment of an inverter according to the invention.

The inverter in FIG. 1 comprises an electron-wave Y-branch switch 1 having a source S1 which is adapted to be connected to a high supply voltage $V_{DD}$, a first drain D1', a second drain D1", and a gate G1. The gate G1 constitutes the input terminal of the inverter and is adapted, depending on its input signal $V_G$, to switch a source current $I_{DD}$ between the first drain D1' and the second drain D1". The first drain D1' is series-connected with a resistor R1' to a low supply voltage which in the embodiment shown is equal to ground. The second drain D1" is series-connected with a resistor R1" to the same low supply voltage, i.e. ground, as the resistor R1'. In the embodiment shown, the output terminal of the inverter is the interconnection point between the second drain D1" and the resistor R1".

When the input signal $V_G$ on the gate G1 is low, the source S1 will be connected to the drain D1" pulling up the output voltage $V_{out}$ to the high supply voltage $V_{DD}$. When the input signal $V_G$ is high, the source S1 will be connected to ground via the resistor R1', while the resistor R1" will ensure that the output voltage Vout is pulled down to a low voltage.

Figure 3:
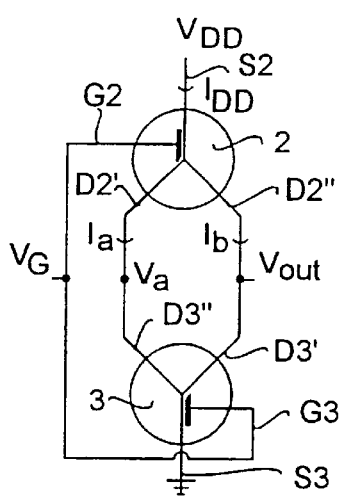
FIG. 3 shows a third embodiment of an inverter.

Another embodiment of an inverter according to the invention is shown in FIG. 3.

The inverter according to FIG. 3 comprises a first electron-wave Y-branch switch 2 and a second electron-wave Y-branch switch 3 which are of the same type as the Y-branch switch 1 in FIG. 1. Thus, each of the Y-branch switches 2 and 3 in FIG. 3 comprises a source S2 and S3, respectively, a first drain D2' and D3', respectively, a second drain D2" and D3", respectively, and a gate G2 and G3, respectively.

The sources S2 and S3 of the Y-branch switches 2 and 3, respectively, are connected to a high supply voltage $V_{DD}$ and a low supply voltage, e.g. ground, respectively.

In accordance with the invention, the gate G2 of the switch 2 and the gate G3 of the switch 3 are interconnected and the interconnection point constitutes the input terminal of the inverter according to FIG. 3, which is supplied with an input signal $V_G$.

The drain D2' of the switch 2 is connected to the drain D3" of the switch 3 while the drain D2" of the switch 2 is connected to the drain D3' of the switch 3. The interconnection point between the drains D2" and D3' constitutes the output terminal of the inverter as indicated by $V_{out}$.

In the inverter according to FIG. 3, when the input signal $V_G$ is high, the switch 3 connects the output terminal $V_{out}$ to ground, while the switch 2 connects the interconnection point $V_a$ between the drains D2' and D3" to $V_{DD}$. When the input signal $V_G$ goes low, $V_{out}$ will instead be connected to $V_{DD}$ and $V_a$ will be connected to ground. Thus, current will flow through the gate only during switching, which is analogous to the behaviour of complementary metal-oxide semiconductors (CMOSs).

The inverter according to FIG. 1 is analogous to NMOS, while the inverter in FIG. 3 is analogous to CMOS. In connection with FETs, NMOS has largely been replaced by CMOS, and for the same reasons, the inverter according to FIG. 3 is more preferred than the inverter according to FIG. 1.

Figure 4:
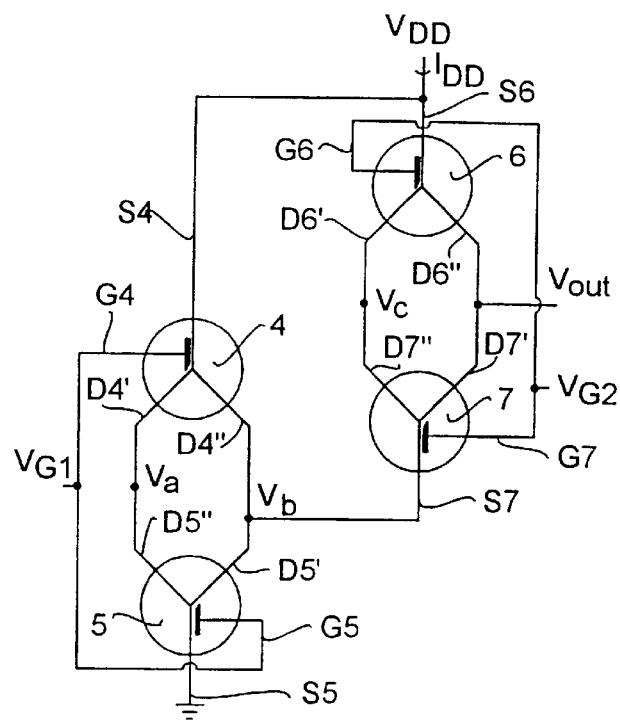
FIG. 4 shows a second embodiment of a NAND-gate.

FIG. 4 shows an embodiment of a NAND gate which comprises two inverters of the type shown in FIG. 3. As in FIG. 3, each inverter in FIG. 4 comprises two Y-branch switches 4 and 5, and 6 and 7, respectively. Each of the switches 4, 5, 6, and 7 comprises a source S4, S5, S6 and S7, respectively, a first drain D4', D5', D6' and D7', respectively, a second drain D4", D5", D6" and D7", respectively, and a gate G4, G5, G6 and G7, respectively.

With reference to FIG. 4, the interconnection point between the drain D4" of the switch 4 and the drain D5' of the switch 5 is connected to the source S7 of the switch 7. The interconnection point between the drain D6" of the switch 6 and the drain D7' of the switch 7 constitutes the output of the embodiment of the NAND gate in FIG. 4. The sources S4 and S6 of the switches 4 and 6, respectively, are both connected to a high supply voltage $V_{DD}$, while the source of the switch 5 is connected to ground as in FIG. 3.

The left inverter comprising the switches 4 and 5, is controlled by an input gate voltage $V_{G1}$ connected to gates G4 and G5, and supplies the voltage $V_b$ to the source S7 of the switch 7 of the right inverter. In this right inverter, an input gate voltage $V_{G2}$ controls whether the output voltage $V_{out}$ is $V_{DD}$ or $V_b$. Only if both gate voltages $V_{G1}$ and $V_{G2}$ are logic ones, the output will be connected to ground.

Figure 5:
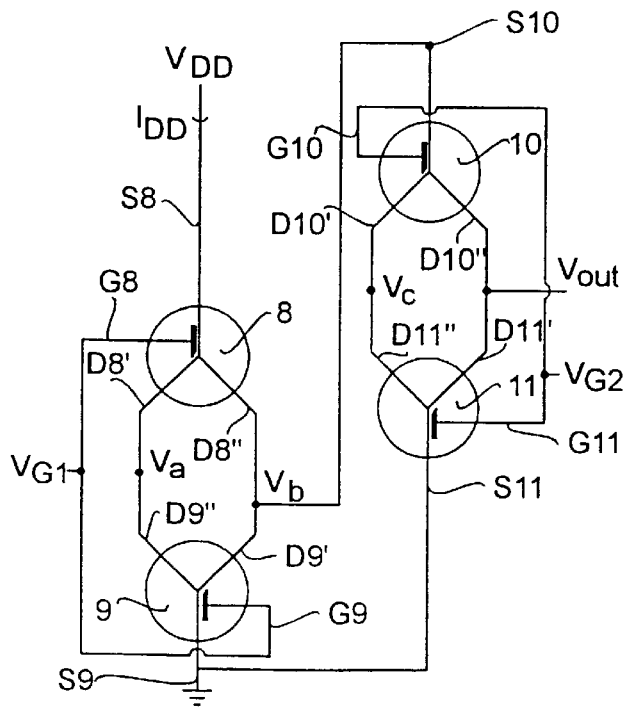
FIG. 5 shows a second embodiment of a NOR-gate.

FIG. 5 shows an embodiment of a NOR gate also comprising two inverters of the type shown in FIG. 3. As in FIG. 3, each inverter in FIG. 4 comprises two Y-branch switches 8 and 9, and 10 and 11, respectively. Each of the switches 8, 9, 10, 15 and 11 comprises a source S8, S9, S10 and S11, respectively, a first drain D8', D9', D10' and D11', respectively, a second drain D8", D9", D10" and D11", respectively, and a gate G8, G9, G10 and G11, respectively.

The only difference between the NOR gate in FIG. 5 and the NAND gate in FIG. 4 is that the source S10 of the switch 10 is connected to the interconnection point between the second drain D8" of the switch 8 and the first drain D9' of the switch 9, while the source S11 of the switch 11 is connected to ground.

Figure 6:
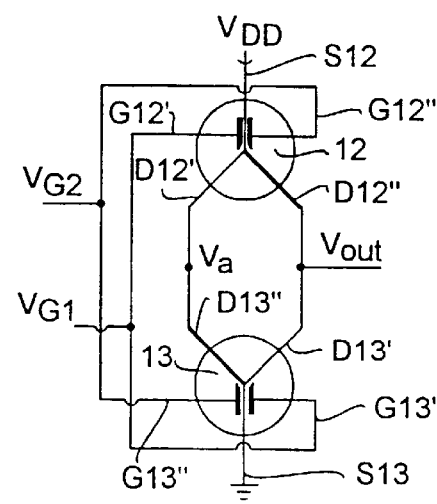
FIG. 6 shows a second embodiment of a gate implementing a logical implication function.

FIG. 6 shows an embodiment of a gate, implementing a logical implication function, based on the inverter in FIG. 3, i.e. with two Y-branch switches 12 and 13 comprising a source S12 and S13, respectively, a first drain D12" and D13', respectively, a second drain D12" and D13", respectively, and two gates G12' and G12", and G13' and G13", respectively. The interconnection point between the gates G12' and G13' constitutes a first input terminal for a gate voltage $V_{G1}$, while the interconnection point between the gates G12" and G13" constitutes a second input terminal for a gate voltage $V_{G2}$.

The logical implication gate in FIG. 6 produces the outputs $V_a=V_{G1}$ AND NOT $V_{G2}$ and $V_{out}=V_{G2}$ OR NOT $V_{G1}$, i.e. both complementary outputs are generated. This provides a factor of two size reduction compared to the NAND gate in FIG. 5 at the price of an unconventional logic basis function.

The logical implication gate in FIG. 6 requires that the two Y-branch switches 12 and 13 are asymmetric as indicated by a thicker line for the drains D12" and D13", respectively. The thick line symbolizes that the current will flow in the "thicker line" drain when the gate voltages $V_{G1}$ and $V_{G2}$ are equal on the two gates. Thus, if $V_{G2} \geq V_{G1}$, the Y-branch switch 12 will connect source S12 to drain D12" and the Y-branch switch 13 will connect source S13 to drain D13". If $V_{G2}<V_{G1}$, source S12 will be connected to drain D12' and source S13 will be connected to drain D13'.

Figure 2A:
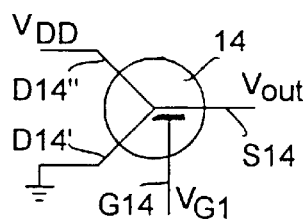
FIG. 2a shows a second embodiment of an inverter.

A smaller version of an inverter can be built using a single Y-branch switch 14 with a gate G14 which is used as an input terminal as shown in FIG. 2a. The two drains D14' and D14" of the Y-branch switch 14 are connected to a low and a high voltage supply, respectively, while the source S14 is used as an output terminal.

For phase-coherent transport, no current flows between the branches D14' and D14" when the Y-branch switch 14 is biased, i.e. when $V_{G1}=0$ or 1. There is a direct current between $V_{DD}$ and ground only for values inbetween, i.e. during switching.

The inverter according to FIG. 2a will be more sensitive to inelastic scattering than the inverters in FIGS. 1 and 3 since scattering may cause a leakage current between the two drains D14' and D14". In the inverter in FIG. 2a this will lead to a larger increase in power dissipation.

Figure 2B:
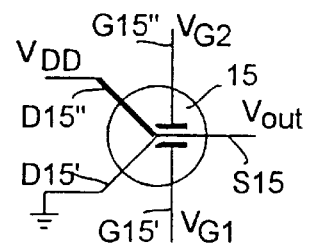
FIG. 2b shows a first embodiment of a logical implication gate.
Figure 2C:
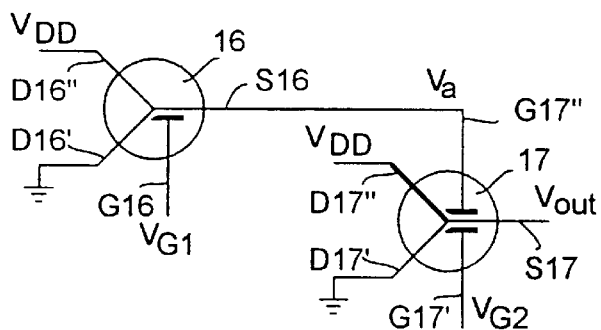
FIG. 2c shows first embodiment of a NAND gate.

Based on the inverter in FIG. 2a, FIG. 2b shows an embodiment of a gate which implements a logical implication, and which requires only a single Y-branch switch 15. The two drains D15' and D15" of the Y-branch switch 15 are coupled to a low supply voltage, ground, and a high supply voltage $V_{DD}$, respectively, while the source S15 is used as an output terminal. Two gates G15' and G15" are provided in this embodiment, and the gates G15' and G15" are supplied with gate voltages $V_{G1}$ and $V_{G2}$, respectively. The output $V_{out}=V_{G1}$ OR NOT $V_{G2}$ is then produced. The Y-branch switch 15 in FIG. 2b is asymmetric as the logical implication gate in FIG. 6, i.e. the source S15 is connected to drain D15' if $V_{G1} \geq V_{G2}$ and to drain D15" if $V_{G1} < V_{G2}$. FIG. 2c shows an embodiment of a NAND gate based on a combination of the inverter in FIG. 2a, and the logical implication gate in FIG. 2b.

As apparent from FIG. 2c, the NAND gate comprises an electron-wave Y-branch switch 16 having a source S16, a first drain D16', a second drain D16", and a gate G16 which constitutes a first input terminal of the NAND. The first drain D16' and the second drain D16" are adapted to be connected to a low voltage supply and a high voltage supply, respectively, while the source S16 is connected to the second gate G17" of a second electron-wave Y-branch switch 17, the first gate G17' of which constitutes a second input terminal of the NAND gate. The first drain D17' and the second drain D17" of that second electron-wave Y-branch switch 17 are adapted to be connected to a low voltage supply and a high voltage supply, respectively, while the source S17 of the electron-wave Y-branch switch 17 constitutes the output terminal of the NAND gate.

Figure 2D:
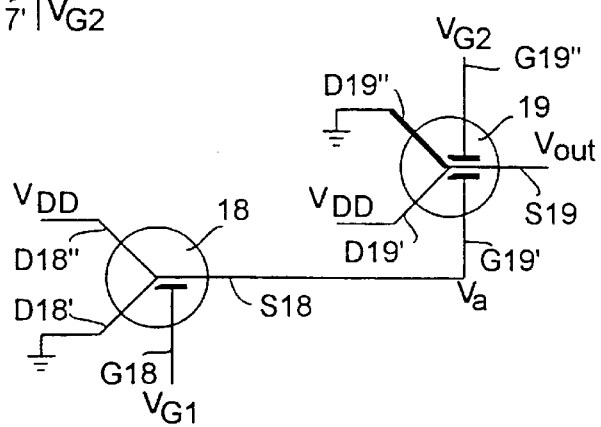
FIG. 2d shows a first embodiment of a NOR gate.

FIG. 2d shows an embodiment of a NOR gate also based on a combination of the inverter in FIG. 2a, and the logical implication gate in FIG. 2b.

As apparent from FIG. 2d, the NOR gate comprises an electron-wave Y-branch switch 18 having a source S18, a first drain D18', a second drain D18", and a gate G18 which constitutes a first input terminal of the NOR gate. The first drain D18' and the second drain D18" are adapted to be connected to a low voltage supply and a high voltage supply, respectively, while the source S18 is connected to the first gate Gl9' of an electron-wave Y-branch switch 19, the second gate G19" of which constitutes a second input of the NOR gate. The first drain D19' and the second drain D19" of the electron-wave Y-branch switch 19 are adapted to be connected to a high voltage supply and a low voltage supply, respectively, while the source S19 of the electron-wave Y-branch switch 19 constitutes the output terminal of the NOR gate.

In all of the gates described above, phase-coherent transport is required within the Y-branch to ensure proper operation. This requirement is clearly apparent from the above mentioned U.S. Pat. No. 5,367,274. In addition, whenever a closed loop of conductors is formed, such as between the two Y-branch switches 2 and 3 in FIG. 3 (and also in FIGS. 4–6), it is essential that phase coherence is broken somewhere in this loop.

With phase-coherent transport, the loop may act as an Aharonov-Bohm interferometer ("Proposed structure for large quantum interference effects", S. Datta, M. R. Melloch, S. Bandyopadhyay, and M. S. Lundstrom, Appl. Phys. Lett., Vol. 48, No. 7, p. 487, 1986.), which is not the intended behaviour in this connection. This interferometer would add oscillations of an uncontrollable nature in response to changed gate voltages.

Using current fabrication technologies, the path-length around the loop, e.g. in FIG. 3, is much longer than the inelastic mean free path of an electron ensuring that no Aharonov-Bohm oscillations will occur. If better fabrication technology allows the mean free path of the electrons to become comparable to the path-length of the loop, a special structure must be inserted somewhere in the loop. This structure, which has the purpose of producing inelastic scattering, may consist simply of a piece of a lower quality semiconductor.

What is claimed is:

1. A logic circuit having at least a first input terminal and at least a first output terminal, characterized in that it comprises at least a first and second electron-wave Y-branch switch, each having a source, a first drain, a second drain, and at least a first gate for switching a source current between the first and the second drain, that the sources of said first and second Y-branch switches are adapted to be connected to a high voltage supply and a low voltage supply, respectively, that the first gates of said first and said second Y-branch switches are interconnected, the interconnection point between said first gates constituting said first input terminal, that the first drain of the first Y-branch switch is connected to the second drain of the second Y-branch switch, and that the second drain of the first Y-branch switch is connected to the first drain of the second Y-branch switch, the interconnection point between said second drain of the first Y-branch switch and said first drain of the second Y-branch switch constituting said first output terminal.

2. A logic circuit according to claim 1, characterized in that said first output terminal is connected to the source of a third electron-wave Y-branch switch, that the first drain of the third Y-branch switch is connected to the second drain of a fourth electron-wave Y-branch switch, the interconnection point between said first drain of the third Y-branch switch and said second drain of the fourth Y-branch switch constituting a second output terminal, that the second drain of the third Y-branch switch is connected to the first drain of the fourth Y-branch switch, that the first gates are interconnected, the interconnection point between said first gates of said third and fourth Y-branch switches constituting a second input terminal, and that the source of said fourth Y-branch switch is adapted to be connected to said high voltage supply.

3. A logic circuit according to claim 1, characterized in that said first output terminal is connected to the source of a fifth electron-wave Y-branch switch, that the second drain of the fifth Y-branch switch is connected to the first drain of a sixth electron-wave Y-branch switch, the interconnection point between said second drain of the fifth Y-branch switch and said first drain of the sixth Y-branch switch constituting a second output terminal, that the first drain of the fifth Y-branch switch is connected to the second drain of the sixth Y-branch switch, that the first gates of said fifth and sixth Y-branch swithches are interconnected, the interconnection point between said first gates of said fifth and sixth Y-branch switches constituting a second input terminal, and that the source of said sixth Y-branch switch is adapted to be connected to said low supply voltage.

4. A logic circuit according to claim 1, characterized in that each of said first and said second electron-wave Y-branch switches have a second gate, and that said second gates are interconnected, the interconnection point between said second gates constituting a second input terminal.

5. A logic circuit having at least one input terminal and one output terminal, characterized in that it comprises an electron-wave Y-branch switch having a source, a first drain, a second drain, and a gate constituting a first input terminal, that the first drain and the second drain are adapted to be connected to a low voltage supply and a high voltage supply, respectively, and that the source constitutes said output terminal.

6. A logic circuit according to claim 5, characterized in that it comprises a second gate constituting a second input terminal.

7. A logic circuit according to claim 5, characterized in that the source is connected to the second gate of a second electron-wave Y-branch switch, the first gate of which constitutes a second input terminal, that the first drain and the second drain of said second electron-wave Y-branch switch are adapted to be connected to a low voltage supply and a high voltage supply, respectively, and that the source of said second electron-wave Y-branch switch constitutes the output terminal.

8. A logic circuit according to claim 5, characterized in that the source is connected to the first gate of a third electron-wave Y-branch switch, the second gate of which constitutes a second input, that the first drain and the second drain of said third electron-wave Y-branch switch are adapted to be connected to a high voltage supply and a low voltage supply, respectively, and that the source of said third electron-wave Y-branch switch constitutes the output terminal.

9. A logic circuit having an input terminal and an output terminal, characterized in that it comprises an electron-wave Y-branch switch having a source, a first drain, a second drain, and a gate constituting said input terminal for switching a source current between the first and the second drain, that the source is adapted to be connected to a high supply voltage, and that the first drain in series with a first resistor and the second drain in series with a second resistor are adapted to be connected to a low supply voltage, the interconnection point between the second drain and the second resistor constituting said output terminal.

* * * * *

UNITED STATES PATENT AND TRADEMARK OFFICE
CERTIFICATE OF CORRECTION

PATENT NO. : 6,091,267
DATED : July 18, 2000
INVENTOR(S) : Palm et al.

It is certified that error appears in the above-identified patent and that said Letters Patent is hereby corrected as shown below:

Title page,
Please add the following,
[30]   Foreign Application Priority Data
-- August 30, 1996   [SE]   Sweden      PCT/SE96/01079 --

Signed and Sealed this

Eighteenth Day of December, 2001

Attest:

JAMES E. ROGAN
Attesting Officer       Director of the United States Patent and Trademark Office